(12) United States Patent
Yamada et al.

(10) Patent No.: US 7,737,248 B2
(45) Date of Patent: Jun. 15, 2010

(54) CHARGE-TRANSPORTING COMPOUND, CHARGE-TRANSPORTING MATERIAL, CHARGE-TRANSPORTING VARNISH, CHARGE-TRANSPORTING THIN FILM, AND ORGANIC ELECTROLUMINESCENT DEVICE

(75) Inventors: Tomohisa Yamada, Funabashi (JP); Takuji Yoshimoto, Funabashi (JP); Go Ono, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 839 days.

(21) Appl. No.: 10/577,333

(22) PCT Filed: Oct. 29, 2004

(86) PCT No.: PCT/JP2004/016094

§ 371 (c)(1), (2), (4) Date: Apr. 28, 2006

(87) PCT Pub. No.: WO2005/042621

PCT Pub. Date: May 12, 2005

(65) Prior Publication Data

US 2007/0031699 A1  Feb. 8, 2007

(30) Foreign Application Priority Data

Oct. 30, 2003  (JP) ............... 2003-369864

(51) Int. Cl.
  *C08G 73/00* (2006.01)
(52) U.S. Cl. .............................. 528/422; 428/690
(58) Field of Classification Search .............. 528/422
  See application file for complete search history.

(56) References Cited

U.S. PATENT DOCUMENTS 4,226,967 A * 10/1980 Tazuke et al. .............. 528/74
4,983,482 A   1/1991 Ong et al.
5,034,296 A   7/1991 Ong et al.
6,143,433 A * 11/2000 Murata et al. .............. 428/690
6,444,768 B1 * 9/2002 Webb et al. ................ 526/237

(Continued)

FOREIGN PATENT DOCUMENTS

JP   8-20771 A   1/1996

(Continued)

OTHER PUBLICATIONS

Tang et al., Appl. Phys. Lett., vol. 51, No. 12, Sep. 21, 1987, pp. 913-915.

*Primary Examiner*—Randy Gulakowski
*Assistant Examiner*—Shane Fang
(74) *Attorney, Agent, or Firm*—Birch, Stewart, Kolasch & Birch, LLP

(57) ABSTRACT

Using a charge transporting organic compound made of a polymer whose polymer main chain has a fluorene derivative, which is substituted with an amino group having an aromatic ring or heterocyclic ring, connected thereto at the 9 position thereof, e.g. a compound represented by the following formula (1), in a charge transporting thin film, the resulting organic EL element ensures low voltage drive, a high luminance, a very long life and no imperfections.

[Chemical Formula 1]

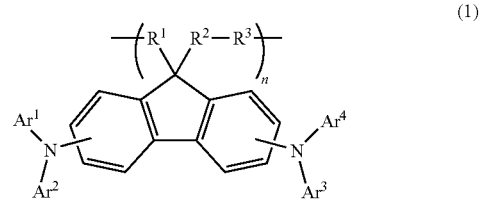

10 Claims, 3 Drawing Sheets

U.S. PATENT DOCUMENTS

| | | | |
|---|---|---|---|
| 7,358,660 B2 * | 4/2008 | Yamada et al. | 313/504 |
| 2004/0135131 A1 | 7/2004 | Treacher et al. | |

FOREIGN PATENT DOCUMENTS

| JP | 8-40995 A | 2/1996 |
|---|---|---|
| JP | 8-40997 A | 2/1996 |
| JP | 11-283750 A | 10/1999 |
| JP | 2000-36390 A | 2/2000 |
| JP | 2001-117250 A | 4/2001 |
| JP | 2001-166519 A | 6/2001 |
| JP | 2001-220410 A | 8/2001 |
| JP | 2002-40686 A | 2/2002 |
| JP | 2002-47271 A | 2/2002 |
| JP | 2002179630 A * | 6/2002 |
| WO | WO-02/077060 A1 | 10/2002 |
| WO | WO-03/020790 A2 | 3/2003 |

* cited by examiner

CHARGE-TRANSPORTING COMPOUND, CHARGE-TRANSPORTING MATERIAL, CHARGE-TRANSPORTING VARNISH, CHARGE-TRANSPORTING THIN FILM, AND ORGANIC ELECTROLUMINESCENT DEVICE

TECHNICAL FIELD

This invention relates to a novel amine compound useful as a charge transporting material, and a charge transporting organic material, a charge transporting varnish, a charge transporting thin film and an organic electroluminescent (hereinafter abbreviated as organic EL) element using the same, respectively.

BACKGROUND ART

For organic EL elements, an organic electroluminescent element showing approximately 1000 cd/m² at a drive voltage of 10 V or below has been reported, for example, by Tang et al., of Eastman Kodak Co., in 1987 (e.g. see Non-patent Document 1).

In order to enhance a luminous efficiency of element, Tang et al., tried optimization between an electrode and an organic compound, thereby making an organic electroluminescent element using an aromatic amine compound as a charge transporting layer and an aluminium complex of 8-hydroxyquinoline as an electron transporting light-emitting layer.

For a hole transporting material, there are known aromatic diamine derivatives (eg, see Patent Documents 1, 2 and 3), aromatic amine-containing polymers (e.g. Patent Documents 4 and 5) and the like. Specific examples include tetraphenylbiphenyldi amine (TPD), N-phenylcarbazole and 4,4'-[N-(1-naphthyl)-N-phenylamino]biphenyl (NPB).

These materials, respectively, have a glass transition temperature of 60° C. to 95° C. and undergo crystallization by virtue of joule heat generated at the time of element drive, thereby causing element degradation. To avoid this, there is a demand for materials that have a high glass transition temperature and are stable.

Polymer materials have been used in some cases so as to increase a glass transition temperature, and polymer materials such as, for example, polyvinylcarbazole and the like are known as such a polymer material. However, elements using polymer materials such as polyvinyl carbazole and the like have the problem in that not only the drive voltage of the element is high, but also a life characteristic is poor. Accordingly, there has been a demand of polymer materials which can lower the element drive voltage and improve a drive life.

Non-patent Document 1:
Applied Physics Letters, Vol. 51. p 913, 1987
Patent document 1:
Japanese Patent Laid-open No. Hei 8-20771
Patent document 2:
Japanese Patent Laid-open No. Hei 8-40995
Patent document 3:
Japanese Patent Laid-open No. Hei 8-40997
Patent document 1:
Japanese Patent Laid-open No. Hei 11-283750
Patent document 1:
Japanese Patent Laid-open No. 2000-36390

DISCLOSURE OF INVENTION

Problems to be Solved by the Invention

The invention has been made under these circumstances and has for its object the provision of a charge transporting compound having excellent charge transportability and a high glass transition temperature, and a charge transporting material, a charge transporting varnish and a charge transporting thin film each containing the compound, and an organic EL element provided with the thin film.

Means for Solving the Invention

We made intensive studies in order to achieve the above object and, as a result, found that a charge transporting compound made of a polymer wherein a polymer main chain has a fluorene derivative, which is substituted with an amino group having an aromatic ring or a heterocyclic ring, connected thereto at the 9 position thereof has excellent charge transportability and a high glass transition temperature and that when the compound is used as a charge transporting thin film, it is enabled to improve a element drive voltage as being low and attain a very long life.

More particularly, the invention provides the following inventions [1] to [13].

[1] A charge transporting compound made of a polymer whose polymer main chain has a fluorene derivative, which is substituted with an amino group having an aromatic ring or a heterocyclic ring, connected thereto at the 9 position of the derivative.

[2] The charge transporting compound of [1], wherein the number average molecular weight ranges 1,000 to 1,000,000.

[3] The charge transporting compound of [1] or [2], wherein said polymer has a structure of the following formula (1)

[Chemical Formula 1]

(1)

(wherein $Ar^1$, $Ar^2$, $Ar^3$ and $Ar^4$ may be the same or different and represent a substituted or unsubstituted aromatic ring or heterocyclic ring provided that $Ar^1$ and $Ar^2$, and $Ar^3$ and $Ar^4$ may be, respectively, combined to form a ring, $R^1$ and $R^2$, respectively, represent a divalent organic group that may have a substituent group, and $R^3$ represent a divalent organic group which has an oxygen atom or nitrogen atom at opposite ends thereof and which may have a substituent group).

[4] The charge transporting compound of [1] or [2], wherein said polymer has a structure of the following formula (2)

[Chemical Formula 2]

(2)

(wherein $Ar^5$, $Ar^6$, $Ar^7$ and $Ar^8$ may be the same or different and represent a substituted or unsubstituted aromatic ring or heterocyclic ring provided that $Ar^1$ and $Ar^2$, and $Ar^3$ and $Ar^4$ may be, respectively, combined to form a ring, $R^4$ represents a divalent organic group that may have a substituent group).

[5] A charge transporting organic material comprising the charge transporting compound defined in any one of [1] to [4] and an electron accepting compound.

[6] The charge transporting organic material of [5], wherein said electron accepting compound comprises a compound represented by the following formula (3)

[Chemical Formula 3]

(3)

(wherein $Ar^9$, $Ar^{10}$, and $Ar^{11}$ may be the same or different and represent a substituted or unsubstituted aromatic ring, and $R^-$ represents an anionic species).

[7] A charge transporting varnish comprising the charge transporting compound defined in any one of [1] to [4].

[8] A charge transporting thin film made by use of the charge transporting varnish of [7].

[9] An organic electroluminescent element comprising the charge transporting thin film of [8].

[10] The organic electroluminescent element of [8], wherein the charge transporting thin film is a hole transporting layer.

[11] The organic electroluminescent element of [8], wherein the charge transporting thin film is a hole injection layer.

[12] The organic electroluminescent element of [8], wherein the charge transporting thin film is an electron transporting layer.

[13] The organic electroluminescent element of [8], wherein the charge transporting thin film is an electron injection layer.

Effects of the Invention

According to the invention, an organic electroluminescent element can be readily obtained as ensuring a low drive voltage, a high luminance, a very long life and no imperfections. The organic electroluminescent element according to the present invention is applied, for example, to a display for such a display device.

DESCRIPTION OF REFERENCE SYMBOLS 1A, 1B, 1C: organic electroluminescent element
2: substrate
3: anode
4: hole transporting layer
5: light-emitting layer
6: cathode
7: electron injection layer
8: hole injection layer

BEST MODE FOR CARRYING OUT THE INVENTION

The invention is described below in more detail.

The charge transporting compound of the invention is a polymer whose polymer main chain has a fluorene derivative, which is substituted with an amino group having an aromatic ring or heterocyclic ring, connected thereto at the 9 position thereof. The charge transportability used herein has the same meaning as conductivity, and means any of hole transportability, electron transportability and charge transportability of both hole and electron.

Most of the polymers have a glass transition temperature of not lower than 100° C. and are able to greatly improve the heat resistance of an organic EL element. The glass transition temperature of the polymer used in the invention should preferably be at 120° C. or over.

Further, the polymer may be either a polymer that is constituted of simple recurring units or a copolymer containing other type of recurring units so as to improve a glass transition temperature and other EL characteristics. It will be noted that two or more types of polymers may be used in admixture.

The number average molecular weight of the polymer is not critical and is in the range of 1,000 to 1,000,000, preferably 1,000 to 100,000, in view of solubility in solvent. It is to be noted that the number average molecular weight is a value measured by gel permeation chromatography.

Specific structures of the polymer are those represented by the above-indicated formula (1).

In the formula (1), $Ar^1$, $Ar^2$, $Ar^3$ and $Ar^4$ are not limited to specific ones, and include a phenyl group, a naphthyl group, an anthoryl group, a pyridyl group, a triazyl group, a pyradyl group, a quinoxalyl group, a thienyl group, a biphenyl group and the like and may have a substituent group.

The substituent group is not critical in type and includes a halogen atom, an alkyl group having 1 to 6 carbon atoms such as a methyl group, an ethyl group or the like, an alkenyl group such as a vinyl group or the like, an alkoxycarbonyl group having 1 to 6 carbon atoms such as a methoxycarbonyl group, an ethoxycarbonyl group or the like, an alkoxy group having 1 to 6 carbon atoms such as a methoxy group, an ethoxy group or the like, an aryloxy group such as a phenoxy group, a benzyloxy group or the like, and a dialkylamino group such as a diethylamino group, a diisopropylamino group or the like.

$R^1$ and $R^2$ are not critical and includes a divalent benzene, alkane, aralkane or the like, respectively.

$R^3$ is not critical in so far as to be a divalent organic group having an oxygen or nitrogen atom at both ends thereof and includes, for example, a divalent organic group having an alkoxy group, a phenoxy group, an ester group, an amido group or an imido group at both ends thereof.

Specific examples of the compound represented by the formula (1) are compounds of the formulas (4) to (9) indicated below although not limited thereto.

[Chemical Formula 4]

(4)

[Chemical Formula 5]

(5)

[Chemical Formula 6]

(6)

-continued

[Chemical Formula 7]

(7)

[Chemical Formula 8]

(8)

[Chemical Formula 9]

(9)

The polymer represented by the foregoing formula (1) is prepared, for example, from a monomer represented by the following formula (10). More particularly, the polymer of the formula (1) can be obtained by reaction between the monomer of the following formula (10) and an organic halogen compound.

It will be noted that specific examples of the substituents for $Ar^1$, $Ar^2$, $Ar^3$, $Ar^4$, $R^1$ and $R^2$ include those indicated hereinabove, respectively.

[Chemical Formula 10]

(10)

(wherein $Ar^1$, $Ar^2$, $Ar^3$ and $Ar^4$ may be the same or different and represent a substituted or unsubstituted aromatic ring or heterocyclic ring provided that $Ar^1$ and $Ar^2$, and $Ar^3$ and $Ar^4$ may be combined to form a ring, respectively, $R^1$ and $R^2$, respectively, represent a divalent organic group which may have a substituent group, and X represents a hydroxyl group or an amino group).

For the polymer, mention may be made of a polymer having such a structure represented by the before-indicated formula (2).

Specific examples of the substituent groups for $Ar^1$, $Ar^2$, $Ar^3$ and $Ar^4$ in the formula (2) are those indicated hereinbefore, respectively. $R^2$ is not critical and includes a divalent alkane or the like.

Specific examples of the compound represented by the formula (2) include the compounds of the formulas (11) to (12) indicated below although not limited thereto.

[Chemical Formula 11]

(11)

[Chemical Formula 12]

(12)

The polymer represented by the foregoing formula (2) can be prepared, for example, according to the following reaction formulas using a starting material indicated below.

[Chemical Formula 13]

The charge transporting organic material of the invention is one which comprises such a charge transporting compound (polymer) as set out hereinabove and an electron accepting compound.

The electron accepting compound is not critical in type and should preferably be the compounds represented by the foregoing formula (3). The compounds represented by the formula (3) may be used singly or in combination of two or more.

In the formula (3), $Ar^1$ to $Ar^3$, respectively, represent an aromatic group which may have a substituent group. Examples of the aromatic group include a phenyl group, a biphenyl group, a triphenyl group, a tetraphenyl group, a 3-nitrophenyl group, a 4-methylthiophenyl group, a 3,5-dicyaophenyl group, an o-, m- and p-tolyl groups, a xylyl group, an o-, m- and p-cumenyl groups and the like.

For the anionic species that is a counterpart with a carbenium cation of the formula (3) and is represented by R⁻, mention is made of $SbX_6^-$, $PX_6^-$, $TaX_6^-$, $ClO_4^-$, $ReO_4^-$, $BX_4^-$, $AsX_6^-$, $AlX_6^-$ and the like. Of these anionic species, $SbX_6^-$ is preferred (wherein X represents a halogen atom). The halogen atoms include a fluorine atom, a chlorine atom, a bromine atom and an iodine atom. Preferably, a fluorine atom or a chlorine atom is used.

Specific examples of the compound represented by the formula (3) include those shown in Tables 1 to 5 although not limited thereto.

TABLE 1

| Compound No. | Chemical Structure |
|---|---|
| A-1 |  |
| A-2 |  |
| A-3 |  |
| A-4 |  |

TABLE 1-continued

| Compound No. | Chemical Structure |
|---|---|
| A-5 |  |

TABLE 2

| Compound No. | Chemical Structure |
|---|---|
| A-6 |  |
| A-7 |  |
| A-8 |  |
| A-9 |  |

TABLE 2-continued

| Compound No. | Chemical Structure |
|---|---|
| A-10 | (structure: 9,9-dimethylfluorene with two diphenylmethyl cations bearing SbCl$_6^-$ counterions) |

TABLE 3

| Compound No. | Chemical Structure |
|---|---|
| A-11 | (structure: tris(4-biphenylyl)methyl cation with SbCl$_6^-$) |
| A-12 | (structure: bis(diphenylmethyl cation) linked by diphenylmethane, two SbCl$_6^-$) |
| A-13 | (structure: bis(diphenylmethyl cation) linked by diphenyl ether, two SbCl$_6^-$) |

TABLE 3-continued

| Compound No. | Chemical Structure |
|---|---|
| A-14 | (structure: 1,4-phenylene-bis(diphenylmethyl cation), two SbCl$_6^-$) |
| A-15 | (structure: 1,4-phenylene-bis[(4-methoxyphenyl)(phenyl)methyl cation], two SbCl$_6^-$) |

TABLE 4

| Compound No. | Chemical Structure |
|---|---|
| A-16 | (structure: tris-cation with three diphenylmethyl cations connected through phenylene linkers, three SbCl$_6^-$) |
| A-17 | (structure: tris-cation analogue of A-16 bearing OMe substituents, three SbCl$_6^-$) |

TABLE 4-continued

| Compound No. | Chemical Structure |
|---|---|
| A-18 |  |
| A-19 |  |

TABLE 5

| Compound No. | Chemical Structure |
|---|---|
| A-20 |  |

TABLE 5-continued

| Compound No. | Chemical Structure |
|---|---|
| A-21 |  |
| A-22 |  |
| A-23 |  |
| A-24 |  |
| A-25 |  |

The charge transporting varnish of the invention is one which comprises such a charge transporting compound (polymer) as set forth hereinabove and a solvent therefor. More particularly, the varnish may be one which comprises, in combination, two components of the charge transporting compound serving to govern the charge transporting mechanism and a solvent, or which comprises, in combination, three components of the charge transporting compound, an electron accepting dopant substance used to improve the charge transportability of the charge transporting material, and a solvent. These are completely dissolved or uniformly dispersed in the solvent. It will be noted that the charge transporting varnish may be one which has charge transportability in itself, or may be one in which a solid film obtained from the varnish exhibits charge transportability.

The electron accepting dopant substance should preferably have high charge acceptability, and is not restrictive with respect to solubility in so far as to be dissolved in at least one type of solvent.

Specific examples of the electron accepting dopant substance include the compounds represented by the above-indicated formula (3), inorganic strong acids such as hydrogen chloride, sulfuric acid, nitric acid, phosphoric acid and the like; Lewis acids such as aluminium (III) chloride ($AlCl_3$), titanium (IV) tetrachloride ($TiCl_4$), boron tribromide ($BBr_3$), boron trifluoride ether complex ($BF_3.OEt_2$), iron (III) chloride ($FeCl_3$), copper (II) chloride ($CuCl_2$), antimony (V) pentachloride ($SbCl_5$), arsenic (V) pentafluoride ($AsF_5$), phosphorus pentachloride ($PF_5$), tris(4-bromophenyl)aluminium hexachloroantimonate (TBPAH) and the like; organic strong acid such as benzenesulfonic acid, tosylic acid, camphorsulfonic acid, hydroxybenzenesulfonic acid, 5-sulfosalicylic acid, dodecylbenzenesulfonic acid, polystyrenesulfonic acid, 1,4-benzodioxanedisulfonic acid derivatives, dinonylnaphthalenesulfonic acid derivatives and the like, and organic or inorganic oxidizing agents such as 7,7,8,8-tetracyanoquinodimetahne (TCNQ), 2,3-dichloro-5,6-dicyano-1,4-benzoquinone (DDQ), iodine and the like although not limited thereto. Of these, the compounds represented by the formula (3) are preferred in view of the excellence in heat resistance.

Specific examples of the hole accepting dopant substance includes alkali metals (Li, Na, K, Cs), and metal complexes such as lithium quinolinolato (Liq), lithium acetylacetonate (Li(acac)) and the like although not limited thereto.

The solvents used include halogen solvents such as chloroform, dichloromethane, dichloroethane, trichloroethylene, ethylene dichloride, tetrachloroethane, chlorobenzene and the like, aprotic solvents such as N-methyl-2-pyrrolidone (NMP), dimethylformamide (DMF), dimethylacetamide (DMAc), dimethylsulfoxide (DMSO), and the like, and polar solvents including alkoxy alcohols such as propylene glycol monobutyl ether, dipropylene glycol monomethyl ether, dipropylene glycol monoethyl ether and the like.

The amount of the solvent is not critical and generally ranges approximately 30 to 99 wt % based on the charge transporting compound.

Aside from the above-indicated solvents, another type of solvent capable of imparting flatness to a film at the time of baking for the purposes of improvement of wettability to substrate, control of the surface tension of solvent, polarity control, boiling point control and the like may be mixed in an amount of 1 to 90 wt %, preferably 1 to 50 wt %, based on the total of the solvents used in the varnish.

Specific examples of such a solvent include butyl cellosolve, diethylene glycol diethyl ether, dipropylene glycol monomethyl ether, ethyl carbitol, diacetone alcohol, γ-butyrolactone, ethyl lactate and the like although not limited thereto.

A charge transporting thin film can be formed by coating the charge transporting varnish onto a substrate or other layer and evaporating a solvent therefrom.

The coating method is not limitative and includes a dipping method, a spin coating method, a transfer printing method, a roll coating method, brushing, an inkjet method, a spraying method or the like.

The solvent evaporation method is not critical and a hot plate or an oven is used, for example, for evaporation in an appropriate atmosphere, i.e. in air or in an inert gas such as nitrogen or the like, or in vacuum, so that a uniformly film-formed surface is obtainable.

The baking temperature is not critical provided that the solvent can be evaporated, and is preferably at 40 to 250° C. In this case, the temperature may be changed by two stages or more for the purposes of ensuring more uniform film formation and permitting the reactions to proceed on a substrate.

The charge transporting thin film obtained by coating and evaporating operations is not critical with respect to the thickness thereof and is preferably at 5 to 200 nm. The method of changing the film thickness includes a method of changing a concentration of solid matter in a varnish and a method of changing an amount of a solution on a substrate upon coating.

The layer made of the thus obtained charge transporting thin film can be used as at least one layer, for example, of an electron injection layer, an electron transporting layer, a hole transporting layer and a hole injection layer in an organic EL element, preferably as at least one layer of the hole transporting layer and hole injection layer.

The embodiments of the organic EL element of the invention are now described in more detail with reference to the accompanying drawings. It is to be noted that the respective schematic views illustrating element structures are by way of examples and should not be construed as limiting the invention thereto. Specific materials constituting individual members, and shapes, structures and the like are not limited to those illustrated hereinbelow, and may be appropriately changed so far as the purpose of the invention can be achieved.

First Embodiment

Figure 1:
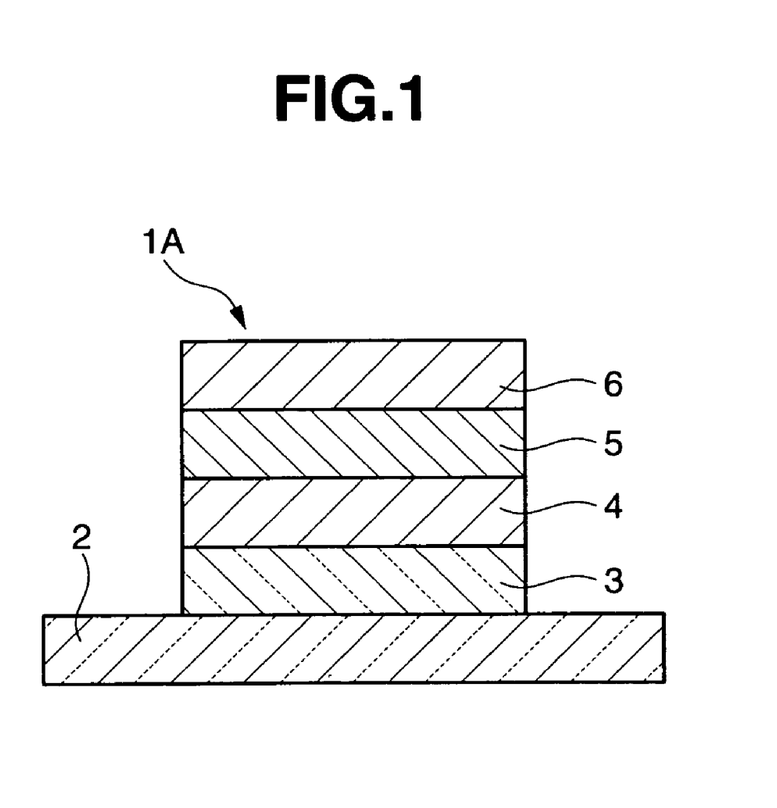
FIG. 1 is a schematic sectional view showing an organic electroluminescent element according to a first embodiment of the invention.

In FIG. 1, there is shown an organic EL element 1A according to a first embodiment of the invention.

This organic EL element 1A includes, on a substrate 2, an anode 3, a hole transporting layer 4, a light-emitting layer 5 and a cathode 6 stacked in this order, in which organic compound layers sandwiched between a pair of the electrode 3, 6 are provided as the hole transporting layer 4 and the light-emitting layer 5.

The hole transporting layer 4 contains a charge transporting compound represented by the above-indicated formula (1). Using the compound represented by the formula (1) in the hole transporting layer 4, an efficiency of hole injection into the light-emitting layer 5 is improved, ensuring low-voltage light emission of the organic EL element.

The light-emitting layer 5 is constituted of a material such as, for example, a compound made of an aromatic amine, coumarin compound, perylene derivatives, anthracene derivatives and rubrene derivatives that are laser dyestuff derivatives, tris(8-hydroxyquinoline) aluminium metal complexes, and the like.

The substrate 2 is constituted, for example, of a transparent insulating material such as glass, plastic films or the like.

The anode 4 is a transparent electrode that usually has a surface resistance of 1 to 50Ω/□ and a visible light transmittance of not lower than 80%. Specific examples include (1) an amorphous or microcrystalline transparent electrode film of indium-tin oxide (ITO) or zinc-aluminium oxide, (2) a transparent electrode obtained by forming a film, which has such a structure that silver, chromium, copper or an alloy of silver and copper in a thickness of approximately 10 nm for ensuring low resistance is sandwiched between amorphous or microcrystalline transparent electrode films of ITO, titanium oxide, tin oxide or the like, on the substrate 2 such as by vacuum deposition, sputtering or the like. Besides, there may be used a semi-transparent electrode formed by thin vacuum deposition of gold or platinum or a semi-transparent electrode covered with a polymer such as polyaniline, polythiophene, polypyrrole or the like.

The cathode 6 is constituted of a metal, an alloy, an electrically conductive compound or a mixture thereof that has a small work function, e.g., a material such as Na, K, Mg, Li, In or the like. The cathode 6 is formed by a vacuum deposition method, a sputtering method or the like.

Second Embodiment

In the following description, the same members as in the first embodiment are, respectively, denoted by the same reference numerals and illustrations thereof are omitted.

Figure 2:
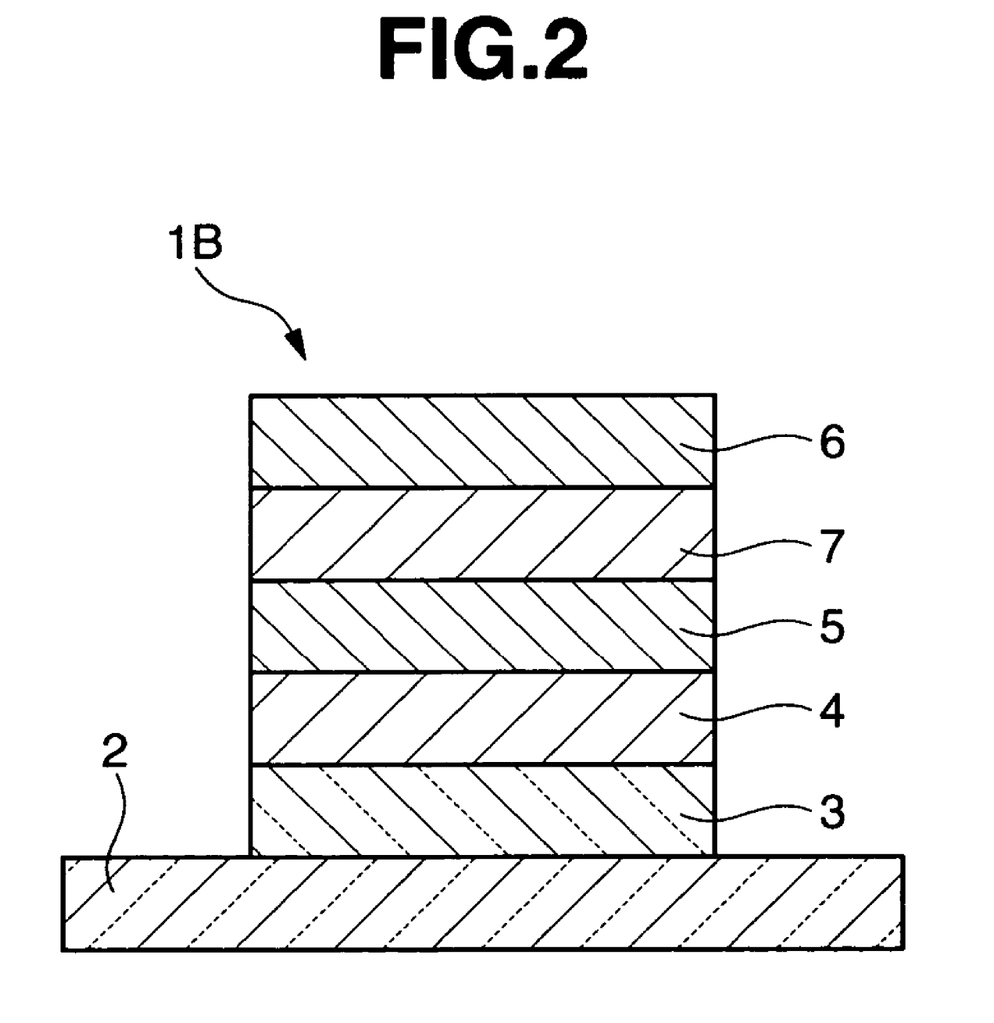
FIG. 2 is a schematic sectional view showing an organic electroluminescent element according to a second embodiment of the invention.

In FIG. 2, an organic EL element 1B according to a second embodiment of the invention is shown.

This organic EL element 1B includes, on a substrate 2, an anode 3, a hole transporting layer 4, a light-emitting layer 5, an electron injection layer 7 and a cathode 6 stacked in this order. The organic compound layers sandwiched between a pair of the electrodes 3, 6 are constituted of the hole transporting layer 4, the light-emitting layer 5 and the electron injection layer 7.

In this embodiment, the charge transporting compound represented by the formula (1) is contained in the electron injection layer as well as in the hole transporting layer 4. In this way, when the compound represented by the formula (1) is used in the electron injection layer 7, the efficiency of electron injection into the light-emitting layer 5 is improved, and it becomes possible to cause the resulting organic EL element to emit light at low voltage.

It will be noted that in this embodiment, the charge transporting compound of the formula (1) may be contained in either of the hole transporting layer or the electron injection layer.

Third Embodiment

In the following description, the same members as used in the first embodiment are designated with the same reference numerals and illustrations thereof are omitted.

Figure 3:
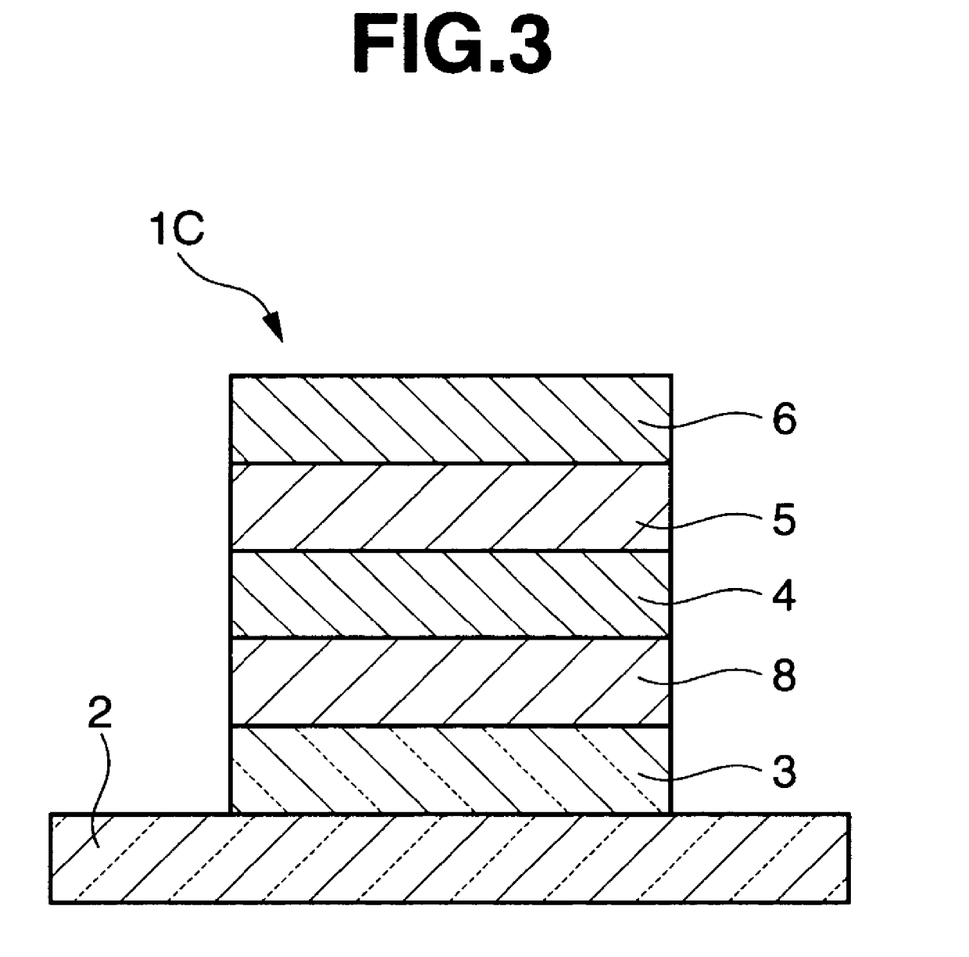
FIG. 3 is a schematic sectional view showing an organic electroluminescent element according to a third embodiment of the invention.

In FIG. 3, there is shown an organic EL element 1C according to a third embodiment of the invention.

This organic EL element 1C includes, on a substrate 2, an anode 3, a hole injection layer 8, a hole transporting layer 4, a light-emitting layer 5 and a cathode 6 stacked in this order, and the organic compound layers sandwiched between paired electrodes 3, 6 are constituted of the hole injection layer 8, hole transporting layer 4 and light-emitting layer 5.

In this embodiment, the charge transporting compound represented by the formula (1) is contained in the hole injection layer 8 as well as in the hole transporting layer 4. When using the compound-represented by the formula (1) further in the hole injection layer 8 as set out above, the efficiency of hole injection into the light-emitting layer 5 is further improved, enabling one to cause the organic EL element 1C to emit light at low voltage.

It will be noted that in this embedment, the charge transporting compound of the formula (1) may be contained in either of the hole transporting layer or the electron injection layer.

EXAMPLES

Next, Synthetic Examples, Examples and Comparative Examples are described to further illustrate the invention in more detail, which should not be construed as limiting the invention to the following examples.

Synthetic Example 1

Palladium acetate (0.081 g, 0.36 mmols) and n-tert-butyl phosphine (0.44 g, 2.17 mmols) were agitated, as a xylene solution (300 ml), in a 500 ml three-necked flask in an atmosphere of nitrogen at room temperature for 5 minutes. Thereafter, 2,7-dibromofluorene (4.7 g, 14.5 mmols) was added and agitated for 5 minutes, followed by further addition of diphenylamine (5 g, 29 mmols) and sodium butoxide (2.78 g, 29 mmols). The temperature was raised to 100° C. and, after reaction for 24 hours, the reaction system was extracted with chloroform and washed with water five times. After dehydration with anhydrous magnesium sulfate, the solvent was removed to obtain a crude product. Purification through column chromatography (chloroform/n-hexane) was carried out to obtain the following intended product (a).

[Chemical Formula 14]

-continued (a)

Compound (a) (1 g, 2 mmols), tetrabutylammonium bromide (TBABr, 0.064 g, 0.2 mmols), α-chloro-4-methoxytoluene (0.624 g, 4 mmols), toluene (100 ml, NaOH (25 g) and water (50 g) were added to a 300 ml recovery flask and were subjected to reaction in an atmosphere of nitrogen, at 100° C. for 24 hours.

A separatory funnel was used to wash the product with water five times and, after dehydration with anhydrous magnesium sulfate, the solvent was removed to obtain a crude product. Purification through column chromatography (chloroform/n-hexane) was carried out to obtain the following intended product (b) (0.87 g, 1 mmol).

[Chemical Formula 15]

(a)

(b)

Compound (b) (1 g, 1 mmol) was added to a 300 ml three-necked flask and dissolved in dichloromethane (100 ml), followed by cooling to −78° C. in an iced bath in an atmosphere of nitrogen. Subsequently, 10 ml of a dichloromethane solution of boron tribromide ($BBr_3$, 0.5 g, 2 mmols) was gently dropped. After the dropping, the mixture was raised to room temperature and further agitated for approximately 10 hours, followed by dropping water to complete the reaction. The dichloromethane phase was extracted with a separatory funnel and washed with water five time. After dehydration with anhydrous magnesium sulfate, the solvent was removed to obtain a crude product. Purification through column chromatography (chloroform/n-hexane) was carried out to obtain the following intended product (c) (0.8 g, 0.8 mmols).

[Chemical Formula 16]

(b)

(c)

Compound (c) (1 g, 1.4 mmols) and 4-fluorophenylsulfone (0.35 g, 1.4 mmols) and potassium carbonate (0.38 g, 2.8 mmols) were dissolved in 50 ml of tetrahydrofuran (THF), followed by reaction in an atmosphere of nitrogen at 130° C. for 24 hours. After completion of the reaction, THF serving as a good solvent and methanol serving as a poor solvent were used to repeat purification by re-precipitation three times to obtain an intended polymer (4) (number average molecular weight: 23,000).

[Chemical Formula 17]

Comparative Example 1

Polyvinyl carbazole (made by Kanto Chemical Inc. Co.) represented by the following formula was spin coated onto an ITI glass substrate 2 under the following conditions to form a hole transporting layer.

[Chemical Formula 18]

(Spin Coating Conditions)
  Solvent: chloroform
  Concentration: 0.01 g/ml
  Spinner revolutions: 3100 r.p.m.
  Spin coating time: 5 seconds Next, a commercially available tris(8-hydroxyquinoline) aluminium (Alq3) (product purified by sublimation) serving as a light-emitting material was formed as a film having a thickness of 50 nm at a deposition rate of 0.3 nm/second while keeping a vacuum deposition apparatus at a vacuum of not higher than $8\times10^{-4}$ Pa, thereby forming a light-emitting layer 5.

[Chemical Formula 19]

Alq3

Further, lithium fluoride (LiF) used as an electron injection material was formed on the light-emitting layer 5 at a deposition rate of 0.01 nm/second in a thickness of 0.5 nm while keeping the vacuum deposition apparatus at a vacuum of not higher than $8\times10^{-4}$ Pa, thereby forming an electron injection layer 7.

Finally, aluminium used as a cathode material was formed at a deposition rate of 0.2 nm/second in a thickness of 100 nm while keeping the vacuum deposition apparatus at a vacuum of $8\times10^{-4}$ Pa, thereby forming a cathode 6 on the electron injection layer 7 to provide an organic EL element. The element characteristics are shown in Table 6.

Example 1

The polymer obtained in Synthetic Example 1 and represented by the formula (4) was spin coated on an ITO glass substrate under the following conditions, thereby forming a hole transporting layer 4.

(Spin Coating Conditions)
Solvent: chloroform
Concentration: 0.01 g/ml
Spinner revolutions: 3100 r.p.m.
Spin coating time: 5 seconds After the coating, the light-emitting layer 5, electron injection layer 7 and cathode 6 were, respectively, formed in the same manner as in Comparative Example 1, thereby making an organic EL element 1B. The element characteristics are shown in Table 6 as well. It will be noted that the respective characteristics in Table 6 measured by used of a voltage generator (DC voltage current source R6145, made by Advantest, Japan Inc.) and a luminance system (BM-8, made by Topcon Corporation).

TABLE 6

|  | Emission-commencing voltage (V) | Voltage at 100 cd/m² (V) | Voltage at 500 cd/m² (V) |
| --- | --- | --- | --- |
| Comparative Example 1 | 10.5 | 16 | 17 |
| Example 1 | 6.5 | 11 | 12 |

The invention claimed is:

1. A charge transporting compound composed of a polymer whose polymer main chain has a fluorene derivative, which is substituted with an amino group having an aromatic ring or a heterocyclic ring, connected thereto at the 9 position of the derivative, wherein said polymer has a structure of the following formula (1)

(1)

wherein $Ar^1$, $Ar^2$, $Ar^3$ and $Ar^4$ may be the same or different and represent a substituted or unsubstituted aromatic ring or heterocyclic ring provided that $Ar^1$ and $Ar^2$, and $Ar^3$ and $Ar^4$ may be, respectively, combined to form a ring, $R^1$ and $R^2$, respectively, represent a divalent benzene, alkane or aralkane, and $R^3$ represents a divalent organic group having a phenoxy group at opposite ends thereof and which may have a substituent group, the number average molecular weight of the polymer ranges from 1,000 to 1,000,000, wherein n is an integer larger than 1.

2. A charge transporting organic material comprising a charge transporting compound defined in claim 1 and an electron accepting compound.

3. The charge transporting organic material as defined in claim 2, wherein said electron accepting compound comprises a compound represented by the following formula (3)

(3)

wherein $Ar^9$, $Ar^{10}$, and $Ar^{11}$ may be the same or different and represent a substituted or unsubstituted aromatic ring, and $R^-$ represents an anionic species.

4. A charge transporting varnish comprising the charge transporting compound defined in claim 1.

5. A charge transporting thin film made by use of the charge transporting varnish defined in claim 4.

6. An organic electroluminescent element comprising the charge transporting thin film defined in claim 5.

7. The organic electroluminescent element as defined in claim 6, wherein the charge transporting thin film is a hole transporting layer.

8. The organic luminescent element as defined in claim 6, wherein the charge transporting thin film is a hole injection layer.

9. The organic luminescent element as defined in claim 6, wherein the charge transporting thin film is an electron transporting layer.

10. The organic electroluminescent element as defined in claim 6, wherein the charge transporting thin film is an electron injection layer.

* * * * *